(12) United States Patent
Fu

(10) Patent No.: US 10,631,447 B1
(45) Date of Patent: Apr. 21, 2020

(54) ELECTROMAGNETIC SHIELDING STRUCTURE FOR EXPANSION CARD WINDOW AND EXPANSION CARD BLANK THEREOF

(71) Applicants: Inventec (Pudong) Technology Corp., Shanghai (CN); Inventec Corporation, Taipei (TW)

(72) Inventor: Yung-Teng Fu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 16/572,645

(22) Filed: Sep. 17, 2019

(30) Foreign Application Priority Data

Sep. 6, 2019 (CN) .......................... 2019 1 0840566

(51) Int. Cl.
  *H05K 9/00* (2006.01)
  *G06F 1/18* (2006.01)
  *H05K 7/14* (2006.01)

(52) U.S. Cl.
  CPC ........... *H05K 9/0049* (2013.01); *G06F 1/182* (2013.01); *G06F 1/185* (2013.01); *H05K 7/1417* (2013.01); *H05K 9/0016* (2013.01)

(58) Field of Classification Search
  CPC ....... H05K 9/0016; G06F 1/182; G06F 1/185; G06F 1/186
  See application file for complete search history.

(56) References Cited

U.S. PATENT DOCUMENTS

| 5,650,922 | A | * | 7/1997 | Ho | ........................ | H05K 7/1422 361/753 |
| 5,679,923 | A | * | 10/1997 | Le | ........................... | G06F 1/182 174/372 |
| 5,686,695 | A | * | 11/1997 | Chan | ...................... | G06F 1/182 174/351 |
| 5,690,306 | A | * | 11/1997 | Roesner | .................. | G06F 1/184 248/222.52 |
| 5,856,632 | A | * | 1/1999 | Bostrom | ................. | G06F 1/182 174/354 |
| 5,980,275 | A | * | 11/1999 | Beaman | .................. | G06F 1/186 361/799 |
| 6,201,711 | B1 | * | 3/2001 | Cherniski | ............... | G06F 1/182 174/359 |

(Continued)

*Primary Examiner* — Hung V Ngo
(74) *Attorney, Agent, or Firm* — Winston Hsu

(57) ABSTRACT

An electromagnetic shielding structure uses at least one expansion card blank to cover an expansion card window. The expansion card blank includes a plate body, a fixing portion, an abutting portion, and an adjoining portion. The fixing portion and the abutting portion are connected to two opposite sides of the plate body respectively. The adjoining portion is connected to another side of the plate body. The expansion card blank is fixed to the expansion card window through the fixing portion and the abutting portion, so as to cover the expansion card window. In different practical instances, the adjoining portion touches a side fringe portion of the expansion card window, the plate body of another adjacent expansion card blank, or a fixing plate of an adjacent expansion card, so that the expansion card window can be covered completely for electromagnetic shielding.

23 Claims, 12 Drawing Sheets

(56) References Cited

U.S. PATENT DOCUMENTS

| | | | | |
|---|---|---|---|---|
| 6,309,037 | B2* | 10/2001 | Bertolami | H05K 7/1429 312/223.2 |
| 6,349,042 | B1* | 2/2002 | Mills | G06F 1/181 165/121 |
| 6,349,043 | B1* | 2/2002 | Jensen | G06F 1/182 174/366 |
| 6,403,879 | B1* | 6/2002 | Clements | H05K 9/0041 174/358 |
| 6,608,758 | B1* | 8/2003 | Hunt | G06F 1/182 174/377 |
| 6,618,271 | B1* | 9/2003 | Erickson | G06F 1/182 174/382 |
| 6,822,877 | B2* | 11/2004 | Chen | G06F 1/18 174/380 |
| 7,158,388 | B2* | 1/2007 | Lohman | G06F 1/184 174/359 |
| 7,659,482 | B2* | 2/2010 | Dittus | G06F 1/186 174/354 |
| 8,359,897 | B2* | 1/2013 | Chen | G06F 1/182 29/413 |
| 2005/0133236 | A1* | 6/2005 | Megason | G06F 1/182 174/51 |
| 2010/0326163 | A1* | 12/2010 | Chen | G06F 1/182 72/379.2 |

* cited by examiner

ELECTROMAGNETIC SHIELDING STRUCTURE FOR EXPANSION CARD WINDOW AND EXPANSION CARD BLANK THEREOF

BACKGROUND OF THE INVENTION

1. Field of the Invention

The present invention relates to an electromagnetic shielding structure, and more particularly to an electromagnetic shielding structure for an expansion card window and to an expansion card blank thereof.

2. Description of the Prior Art

Common electronic apparatuses are usually equipped with expansion slots for expansibility. An expansion card inserted into the expansion slot can expose its connection ports through an expansion card window of the device casing of the electronic apparatuses, so as to connect with external devices. When no expansion card is inserted into the expansion slot, the expansion card window is usually covered by a blank for protection of the interior of the electronic apparatus. In general, the expansion card window is made by a metal plate. In order to protect the operation of the electronic components inside the electronic apparatus from interfering with the exterior electromagnetic field, the blank is also made by a metal plate and can touch the expansion card window so as to provide electromagnetic shielding. However, in practice, the width of the expansion card window needs to be in cooperation with the widths of the expansion cards, e.g. standard width, double width and so on. In principle, for expansion card windows with different widths, corresponding blanks are required. Even if two blanks of standard width are fixed side by side on an expansion card window of double width, there still exists an obvious gap between the blanks, which makes the electromagnetic shielding effect limited. This phenomenon makes the two kinds of blanks unsuitable to exchange with each other, which induces inconvenience of use and also increases the accessory cost. Furthermore, when an expansion card of standard width is used to an expansion card window of double width, the left opening still cannot be effectively covered by a blank of standard width, which will produce a gap that reduces the electromagnetic shielding effect.

SUMMARY OF THE INVENTION

An objective of the invention is to provide an electromagnetic shielding structure, which uses an expansion card blank that has an adjoining portion capable of touching an adjacent structure for electromagnetic shielding.

An electromagnetic shielding structure according to the invention includes a fixing frame and an expansion card blank. The fixing frame has an expansion card window. The expansion card window has an upper fringe portion and a lower fringe portion. The expansion card blank includes a plate body, a fixing portion, an abutting portion, and an adjoining portion. The plate body extends along a first direction. The fixing portion is connected to a first side of the plate body. The abutting portion is connected to a second side of the plate body. The second side is opposite to the first side in the first direction. The adjoining portion includes a flat plate portion and a plurality of elastic pieces. The flat plate portion is connected to a third side of the plate body and extends parallel to the plate body along a second direction. The third side is located between the first side and the second side. The second direction is perpendicular to the first direction. The elastic pieces protrude from the flat plate portion in a third direction. The third direction is perpendicular to the first direction and the second direction. Therein, the expansion card blank is detachably fixed to the fixing frame by the fixing portion detachably fixed to the upper fringe portion and by the abutting portion abutting against the lower fringe portion, so that the plate body covers the expansion card window. Thereby, in different practical instances, the elastic pieces can touch a side fringe portion of the expansion card window, the plate body of another adjacent expansion card blank, or a fixing plate of an adjacent expansion card, so that the expansion card window can be covered completely for electromagnetic shielding.

Another objective of the invention is to provide an expansion card blank, of which an adjoining portion can touch an adjacent structure for electromagnetic shielding.

An expansion card blank according to the invention includes a plate body, a fixing portion, an abutting portion, and an adjoining portion. The plate body extends along a first direction. The fixing portion is connected to a first side of the plate body. The abutting portion is connected to a second side of the plate body. The second side is opposite to the first side in the first direction. The adjoining portion includes a flat plate portion and a plurality of elastic pieces. The flat plate portion is connected to a third side of the plate body and extends parallel to the plate body along a second direction. The third side is located between the first side and the second side. The second direction is perpendicular to the first direction. The elastic pieces protrude from the flat plate portion in a third direction. The third direction is perpendicular to the first direction and the second direction. Thereby, in different practical instances, the elastic pieces can touch a side fringe portion of the expansion card window, the plate body of another adjacent expansion card blank, or a fixing plate of an adjacent expansion card, so that the expansion card window can be covered completely for electromagnetic shielding.

Compared with the prior art, the expansion card blank according to the invention can effectively touch adjacent structures (e.g. a side fringe portion of the expansion card window, the plate body of another adjacent expansion card blank, a fixing plate of an adjacent expansion card, and so on), so that the gaps between the components can be eliminated or greatly reduced so as to make the expansion card window be effectively covered to produce a good electromagnetic shielding effect. Furthermore, the adjoining portion of the expansion card blank according to the invention has the capability of joining with another expansion card blank. Several expansion card blanks can be used in combination to be suitable for expansion card windows of different widths. It can broaden the application range of the expansion card blank and also can solve the problem in the prior art effectively that the cost is increased due to the preparation of corresponding blanks required for expansion card window of different widths.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
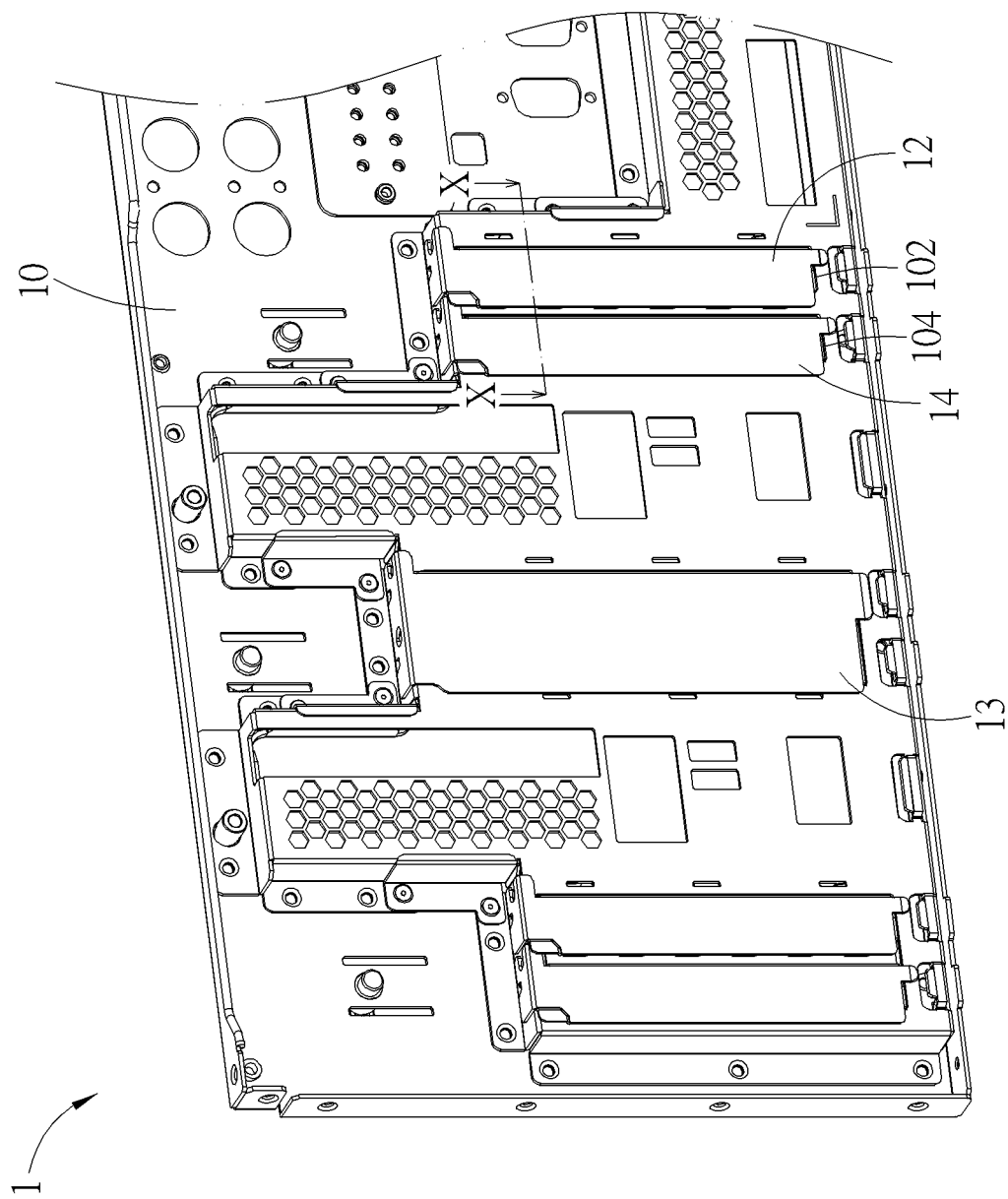
FIG. 1 is a schematic diagram illustrating an electromagnetic shielding structure according to an embodiment.
Figure 2:
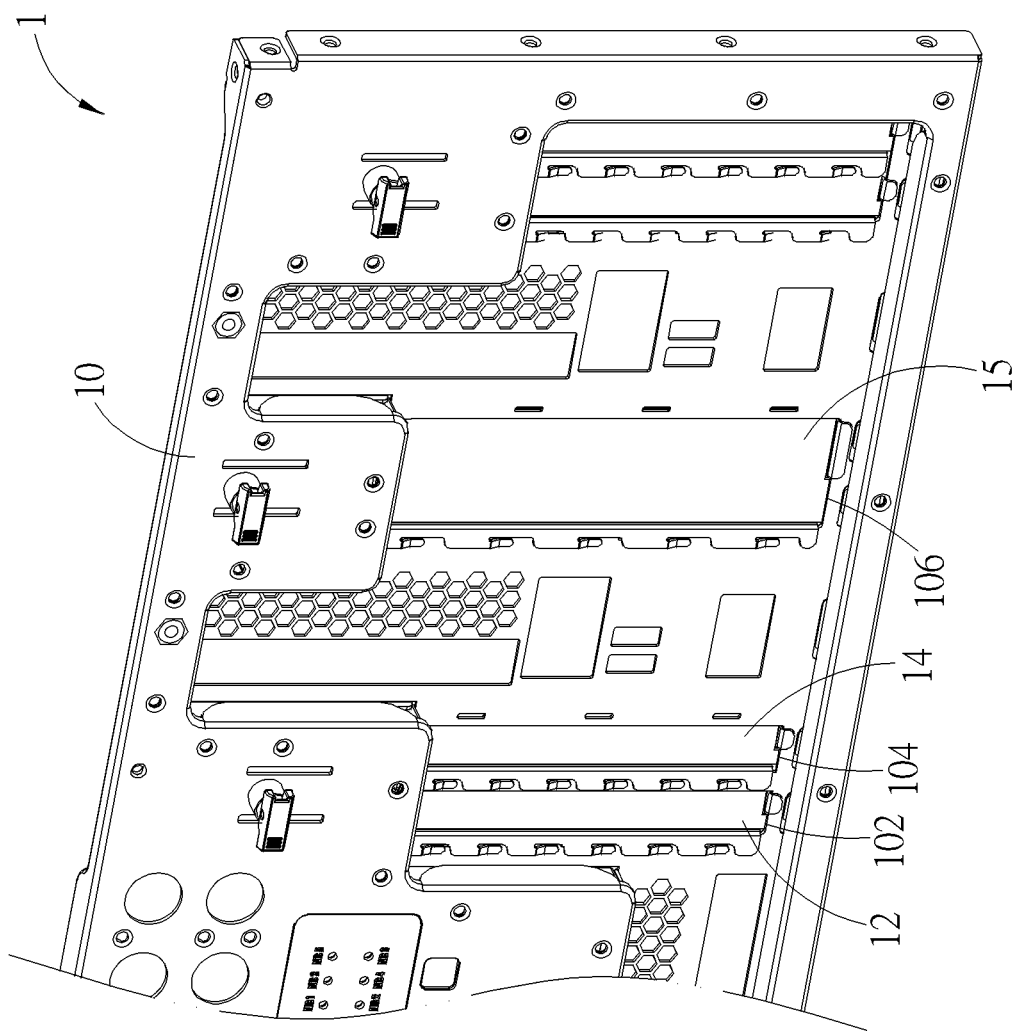
FIG. 2 is a schematic diagram of FIG. 1 in another view point.
Figure 3:
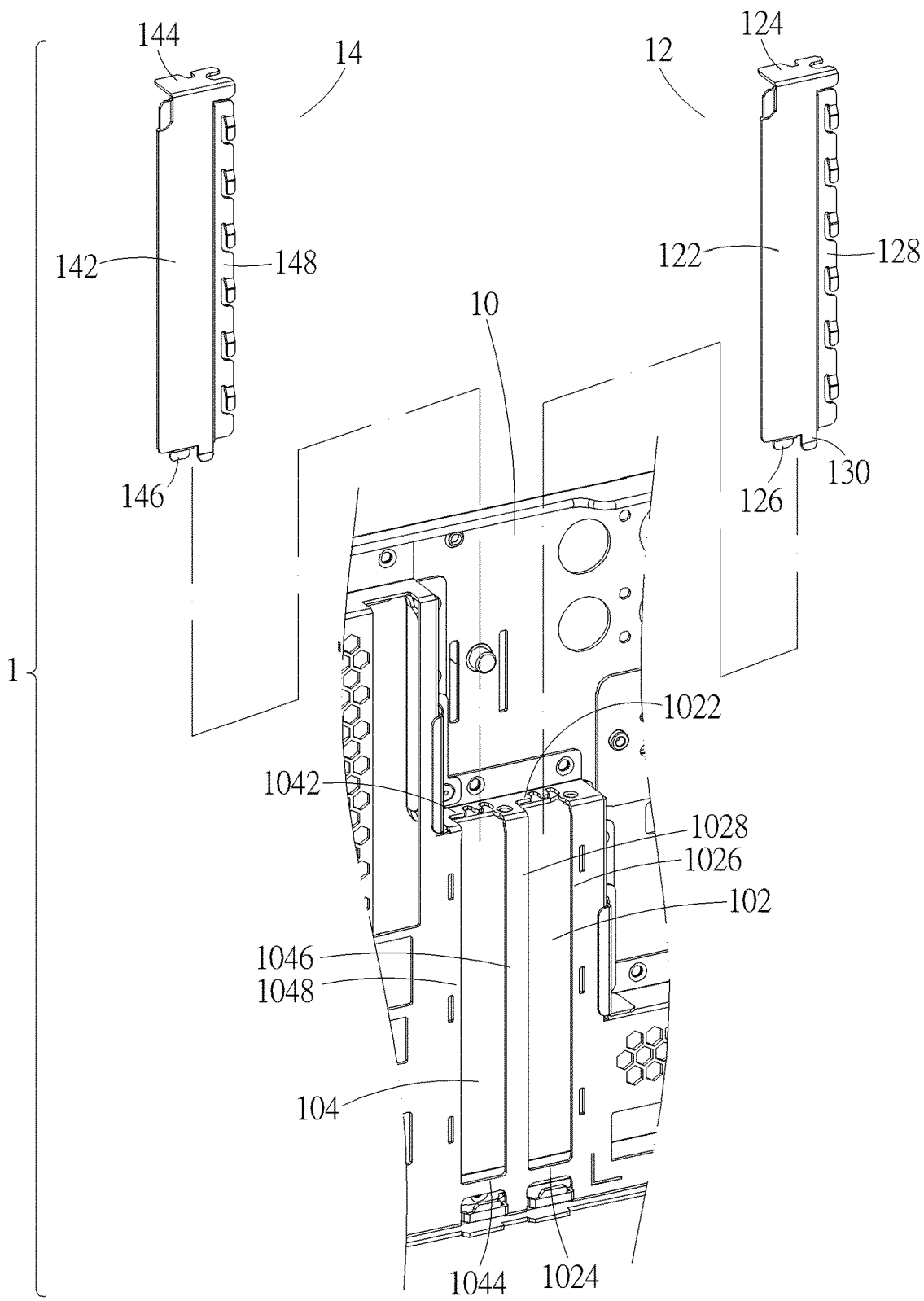
FIG. 3 is an exploded view of the electromagnetic shielding structure in FIG. 1.

Please refer to FIG. 1 to FIG. 3. An electromagnetic shielding structure 1 according to an embodiment is disposed at but not limited to a back plate of an electronic apparatus. The electromagnetic shielding structure 1 includes a fixing frame 10, a first expansion card blank 12, and a second expansion card blank 14. The fixing frame 10 has a first expansion card window 102 and a second expansion card window 104. The first expansion card blank 12 and the second expansion card blank 14 can be detachably fixed to the fixing frame 10 to cover the first expansion card window 102 and the second expansion card window 104 respectively. The side portions of the first expansion card blank 12 and the second expansion card blank 14 touch the first expansion card window 102 and the second expansion card window 104 respectively for enhancing the electromagnetic shielding effect.

Figure 4:
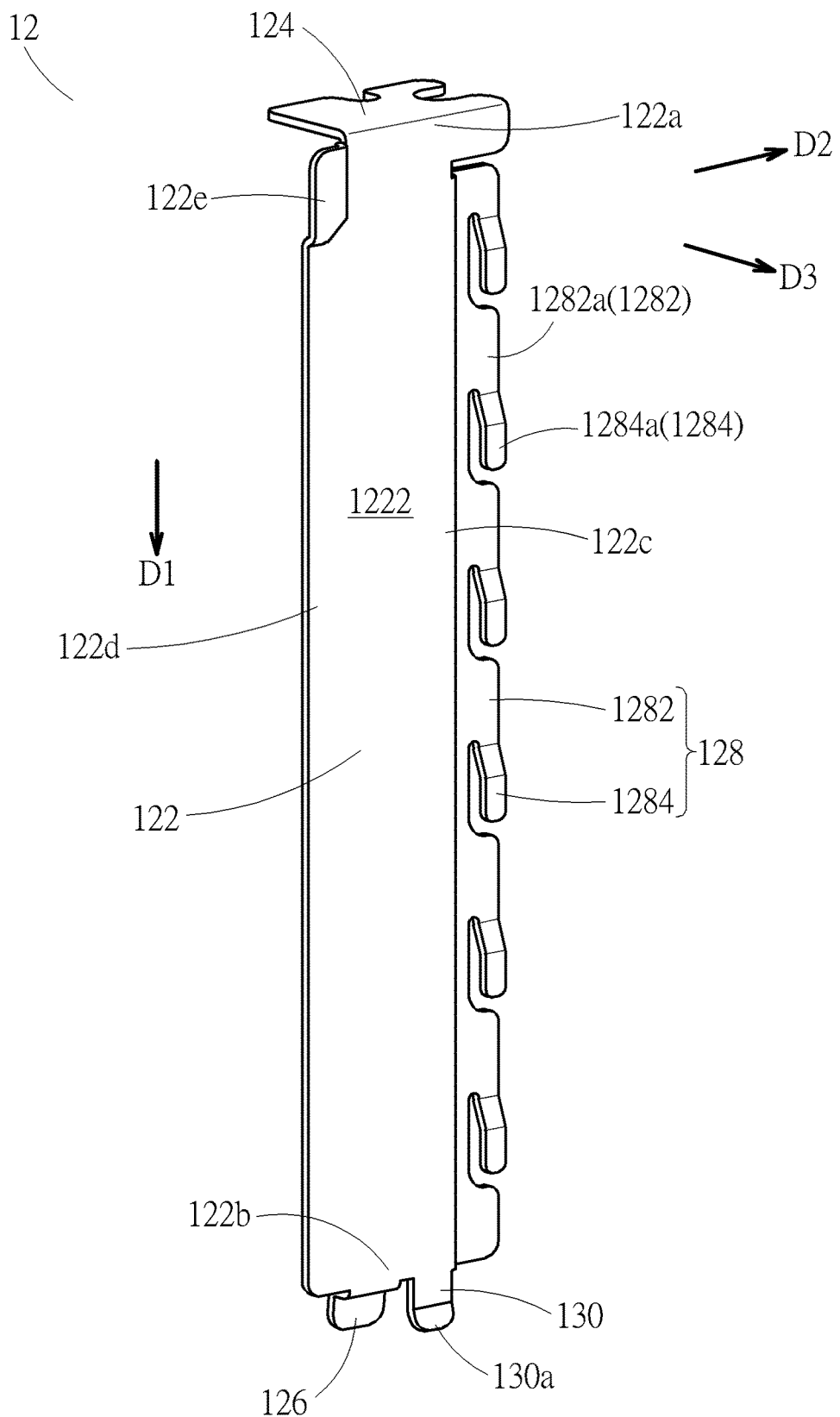
FIG. 4 is a schematic diagram illustrating a first expansion card blank of the electromagnetic shielding structure in FIG. 1.
Figure 5:
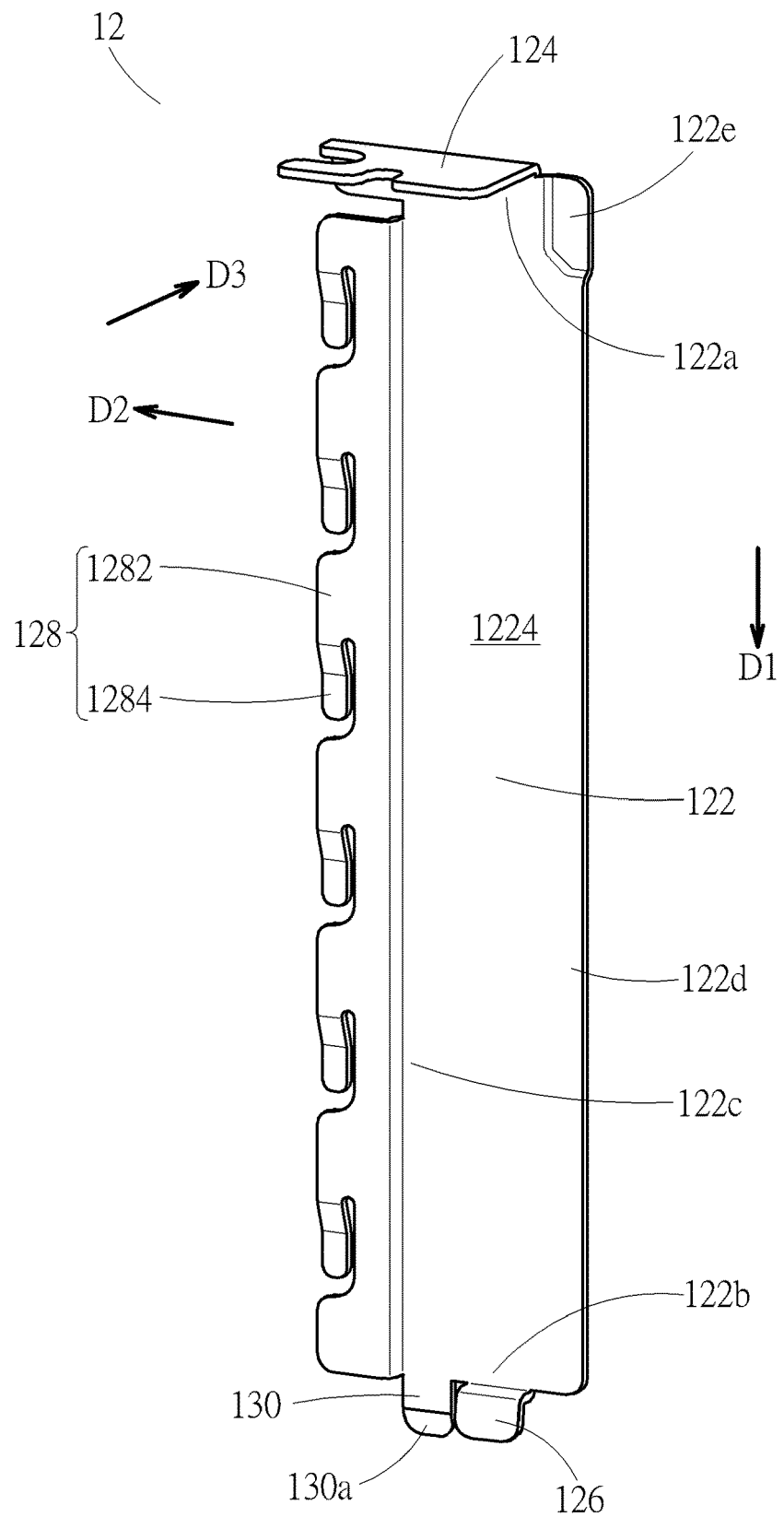
FIG. 5 is a schematic diagram illustrating the first expansion card blank in FIG. 4 in another view point.

Please also refer to FIG. 4 and FIG. 5. The first expansion card blank 12 includes a first plate body 122, a first fixing portion 124, a first abutting portion 126, and a first adjoining portion 128. The first plate body 122 extends along a first direction D1 (indicated by an arrow in FIG. 4 and FIG. 5). The first fixing portion 124 is connected to a first side 122a of the first plate body 122. The first abutting portion 126 is connected to a second side 122b of the first plate body 122. The second side 122b is opposite to the first side 122a in the first direction D1. The first adjoining portion 128 includes a first flat plate portion 1282 and a plurality of first elastic pieces 1284. The first flat plate portion 1282 is connected to a third side 122c of the first plate body 122 and extends parallel to the first plate body 122 along a second direction D2 (indicated by an arrow in FIG. 4 and FIG. 5). The third side 122c is located between the first side 122a and the second side 122b. The second direction D2 is perpendicular to the first direction D1. The first elastic pieces 1284 protrude from the first flat plate portion 1282 in a third direction D3 (indicated by an arrow in FIG. 4 and FIG. 5). The third direction D3 is perpendicular to the first direction D1 and the second direction D2. The first expansion card window 102 has a first upper fringe portion 1022 and a first lower fringe portion 1024. The first expansion card blank 12 is detachably fixed to the fixing frame 10 by the first fixing portion 124 detachably fixed to the first upper fringe portion 1022 (e.g. through but not limited to a screw that is not shown in the figures) and by the first abutting portion 126 abutting against the first lower fringe portion 1024, so that the first plate body 122 covers the first expansion card window 102. Furthermore, the first expansion card window 102 has a first side fringe portion 1026 and a second side fringe portion 1028 opposite to the first side fringe portion 1026. The first side fringe portion 1026 and the second side fringe portion 1028 are located between the first upper fringe portion 1022 and the first lower fringe portion 1024. After the first expansion card blank 12 is installed onto the fixing frame 10, the first flat plate portion 1282 and the first side fringe portion 1026 overlap in the third direction D3. The first elastic pieces 1284 elastically abut against the first side fringe portion 1026. The first plate body 122 touches the second side fringe portion 1028. The first plate body 122 and the second side fringe portion 1028 overlap in the third direction D3. Thereby, the first expansion card blank 12 is structurally connected to the four sides of the first expansion card window 102, which is conducive to the electromagnetic shielding. Furthermore, in the embodiment, the first expansion card blank 12 substantially covers the whole first expansion card window 102, which further enhances the electromagnetic shielding effect.

Figure 6:
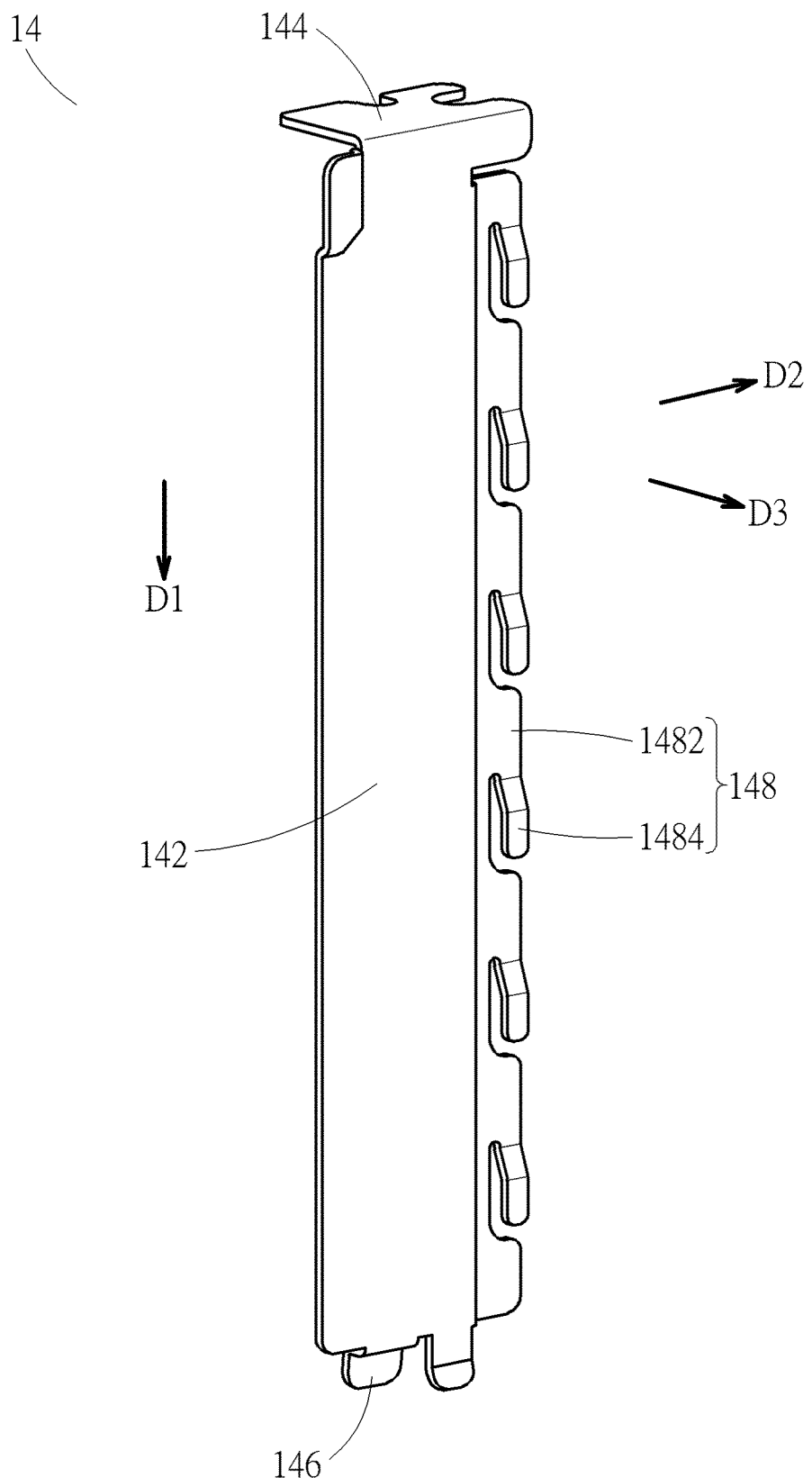
FIG. 6 is a schematic diagram illustrating a second expansion card blank of the electromagnetic shielding structure in FIG. 1.

Please also refer to FIG. 6. Similarly, the second expansion card blank 14 includes a second plate body 142, a second fixing portion 144, a second abutting portion 146, and a second adjoining portion 148. The second fixing portion 144 and the second abutting portion 146 are connected to two opposite sides of the second plate body 142 respectively. The second adjoining portion 148 is connected to another side of the first plate body 142. The second adjoining portion 148 includes a second flat plate portion 1482 and a plurality of second elastic pieces 1484 connected to the second flat plate portion 1482. The second elastic pieces 1484 protrude from the second flat plate portion 1482. The second expansion card window 104 has a second upper fringe portion 1042, a second lower fringe portion 1044, a third side fringe portion 1046, and a fourth side fringe portion 1048. The third side fringe portion 1046 and the fourth side fringe portion 1048 are opposite to each other and are located between the second upper fringe portion 1042 and the second lower fringe portion 1044. The second expansion card blank 14 is detachably fixed to the fixing frame 10 by the second fixing portion 144 detachably fixed to the second upper fringe portion 1042 and by the second abutting portion 146 abutting against the second lower fringe portion 1044, so that the second plate body 142 covers the second expansion card window 104. Therein, the second flat plate portion 1482 and the third side fringe portion 1046 overlap in the third direction D3. The second elastic pieces 1484 elastically abut against the third side fringe portion 1046. The second plate body 142 touches the fourth side fringe portion 1048. The second plate body 142 and the fourth side fringe portion 1048 overlap in the third direction D3. Thereby, the second expansion card blank 14 is structurally connected to the four sides of the second expansion card window 104, which is conducive to the electromagnetic shielding. Furthermore, in the embodiment, the second expansion card blank 14 substantially covers the whole second expansion card window 104, which further enhances the electromagnetic shielding effect. Furthermore, in the embodiment, because the first expansion card window 102 and the second expansion card window 104 are adjacent to each other, the second side fringe portion 1028 of the first expansion card window 102 and the third side fringe portion 1046 of the second expansion card window 104 can be regarded as the same one in structural logic. In addition, in the embodiment, the first expansion card blank 12 and the second expansion card blank 14 are the same in structural logic; further, the first expansion card blank 12 and the second expansion card blank 14 are structurally the same. Therefore, for simplification of description, the following descriptions will be based on the first expansion card blank 12. For other descriptions about the second expansion card blank 14, please refer to the relevant descriptions of the first expansion card blank 12, which will not be described in addition.

Figure 7:
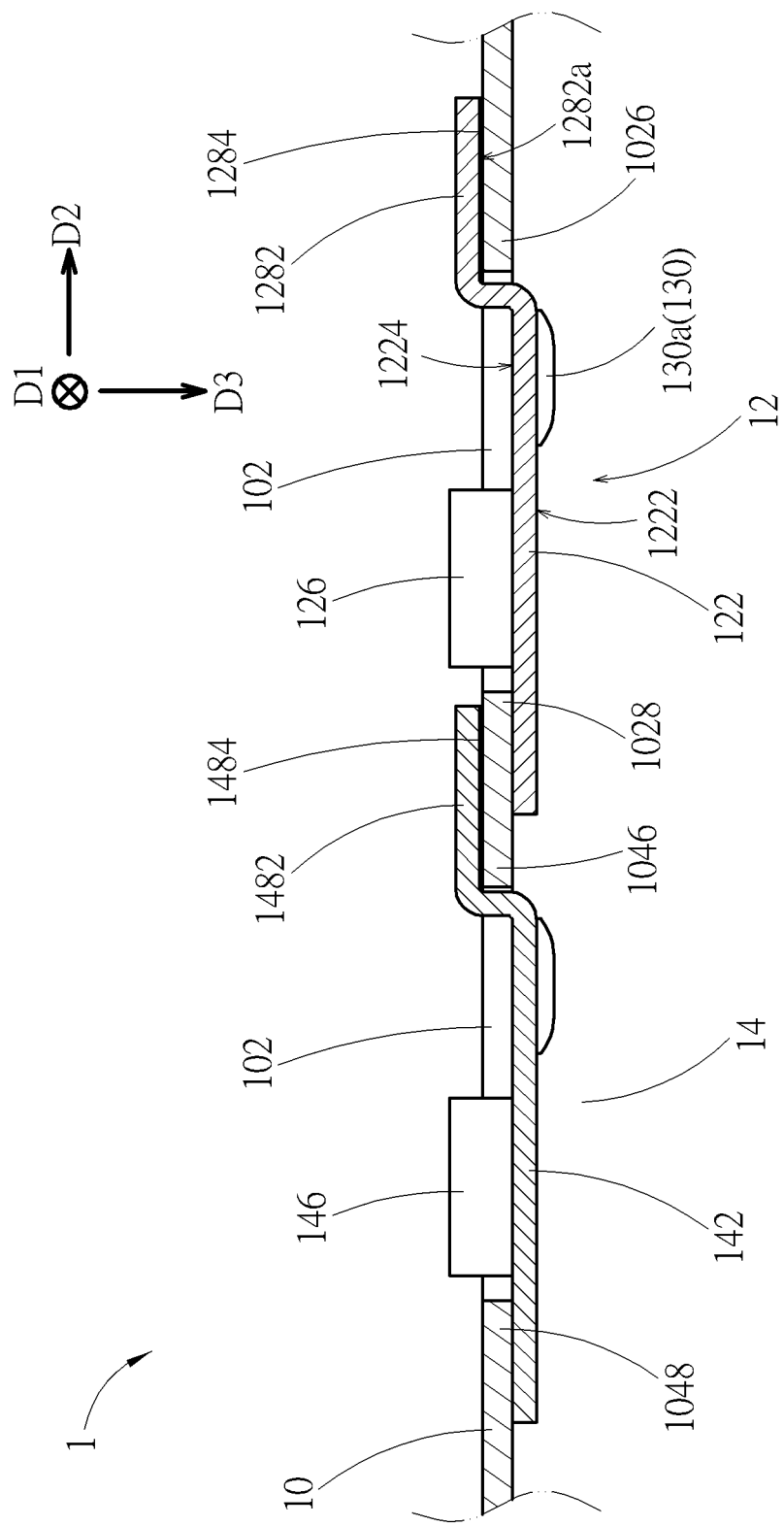
FIG. 7 is a sectional view of the electromagnetic shielding structure along the line X-X in FIG. 1.

In the embodiment, as shown by FIG. 1, FIG. 2, FIG. 4, FIG. 5 and FIG. 7, the first plate body 122 has a first surface 1222 and a second surface 1224 opposite to the first surface 1222 in the third direction D3. The first flat plate portion 1282 has a third surface 1282a in the third direction D3 toward the second surface 1224 (or the third surface 1282a and the second surface 1224 are opposite to each other in the third direction D3). The first elastic piece 1284 protrudes from the third surface 1282a and has a contact surface 1284a. The contact surface 1284a and the second surface 1224 are coplanar; in practice, the contact surface 1284a also can be slightly protrusive relative to the second surface 1224. In other words, in the third direction D3, the first flat plate portion 1282 is lower than the first plate body 122, or the first flat plate portion 1282 and the first plate body 122 are disposed to be staggered in the third direction D3, so that the first flat plate portion 1282 and the first plate body 122 form a structural step in the third direction D3. This structure feature is conducive to the fitting of the first expansion card blank 12 with the fixing frame 10. As shown by FIG. 1, the first expansion card blank 12 is installed to the fixing frame 10 from the inner side of the fixing frame 10. As shown by FIG. 2, the first flat plate portion 1282 is at the outer side of the fixing frame 10. The first elastic piece 1284 elastically abuts against the outer surface of the fixing frame 10 through the contact surface 1284a. In the third direction D3, the first flat plate portion 1282 (or the first adjoining portion 128) and the first plate body 122 are located at two sides of the fixing frame 10, as shown by FIG. 7. Furthermore, the first plate body 122 has a flat protrusion 122e adjacent to the first fixing portion 124 at a fourth side 122d of the first plate body 122. The fourth side 122d is opposite to the third side 122c in the second direction D2. The flat protrusion 122e and the second plate body 142 overlap in the third direction D3 (as shown by FIG. 1). This structure feature can avoid a structural interference of the first plate body 122 with the second plate body 142, so the first expansion card blank 12 and the second expansion card blank 14 can be firmly installed onto the fixing frame 10 respectively. In practice, the flat protrusion 122e touching the second plate body 142 can enhance the electrical connection of the first expansion card blank 12 and the second expansion card blank 14 and also is conducive to the whole electromagnetic shielding effect.

Furthermore, in the embodiment, the first expansion card blank 12 includes a guiding portion 130 connected to the second side 122b of the first plate body 122 adjacent to the first abutting portion 126. The guiding portion 130 and the first abutting portion 126 are located at two sides of the first lower fringe portion 1024 in the third direction D3. This structure feature can form a slot structure, in which the first lower fringe portion 1024 can be inserted. It is conducive to a stable connection of the first expansion card blank 12 and the first lower fringe portion 1024. Furthermore, in the embodiment, the guiding portion 130 has a guiding slope surface 130a protruding from the first abutting portion 126 in the first direction D1. The guiding slope surface 130a facilitates the connection of the first expansion card blank 12 and the first lower second direction D2 fringe portion 1024.

Furthermore, in the embodiment, the first expansion card blank 12 can be made by a metal stamping part. The first fixing portion 124 is formed by a portion of the metal stamping part bending and extending from the first side 122a of the first plate body 122. The first elastic piece 1284 is formed by a portion of the metal stamping part bending upward. However, it is not limited thereto in practice. For example, the first expansion card blank 12 is formed by combining several components; therein, the first elastic piece 1284 is formed by but not limited to fixing another elastic piece to the first flat plate portion 1282 (e.g. by but not limited to soldering). In addition, in practice, the first expansion card window 102 and the second expansion card window 104 can be different in size, and the corresponding first expansion card blank 12 and the corresponding second expansion card blank 14 are also different in size. For example, the width of an expansion card blank 15 shown in FIG. 1 and FIG. 2 (e.g. the dimension thereof in the second direction D2) is about twice that of the first expansion card blank 12 or the second expansion card blank 14. The width of the corresponding expansion card window 106 is also about twice that of the first expansion card window 102 or the second expansion card window 104. Other practicable variants will not be described in addition.

Figure 8:
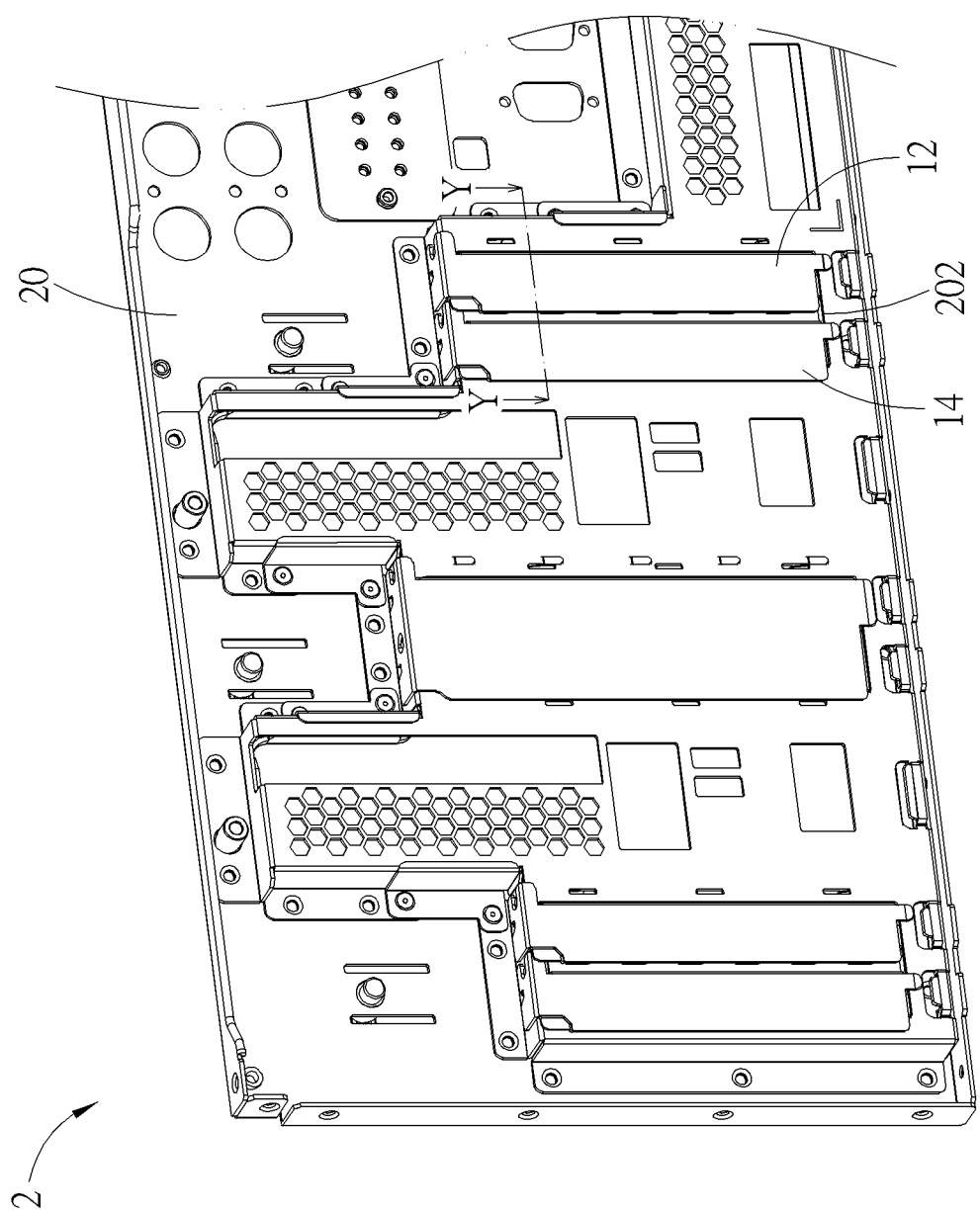
FIG. 8 is a schematic diagram illustrating an electromagnetic shielding structure according to an embodiment.
Figure 9:
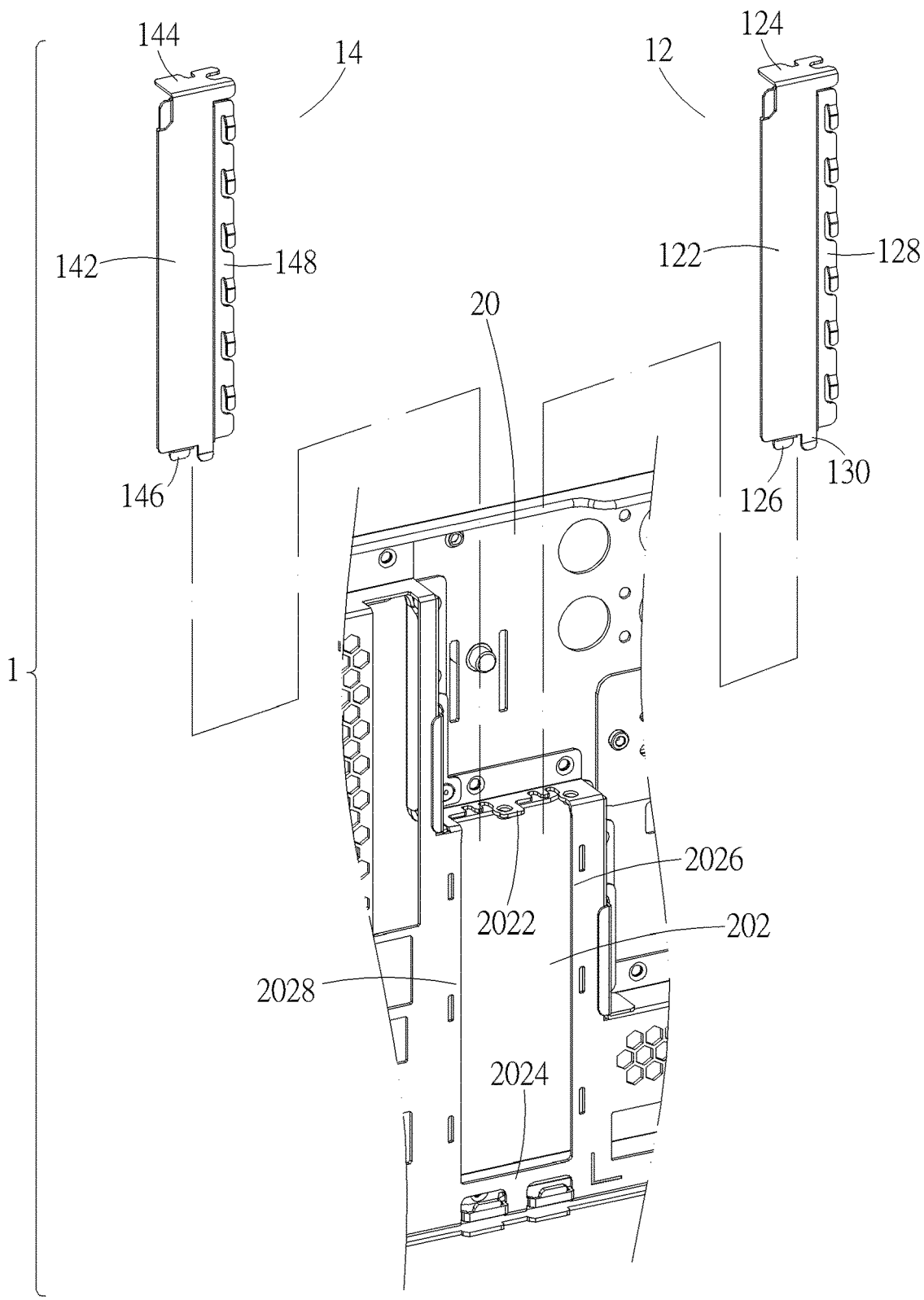
FIG. 9 is an exploded view of the electromagnetic shielding structure in FIG. 8.

Please refer to FIG. 8 and FIG. 9. An electromagnetic shielding structure 2 according to an embodiment is disposed at but not limited to a back plate of an electronic apparatus. The electromagnetic shielding structure 2 is structurally similar to the electromagnetic shielding structure 1. For simplification of description, the electromagnetic shielding structure 2 uses the first expansion card blank 12 and the second expansion card blank 14 of the electromagnetic shielding structure 1. Therefore, in the embodiment, for other descriptions about the first expansion card blank 12 and the second expansion card blank 14, please refer to the relevant descriptions of the first expansion card blank 12 and the second expansion card blank 14 in the foregoing, which will not be described in addition. In the embodiment, the electromagnetic shielding structure 2 includes a fixing frame 20 and the first expansion card blank 12 and the second expansion card blank 14 mentioned above. The fixing frame 20 has an expansion card window 202. The first expansion card blank 12 and the second expansion card blank 14 are detachably fixed to the fixing frame 10 so as to cover the expansion card window 202 together. The first expansion card blank 12 and the second expansion card blank 14 touch each other and touch the expansion card window 202 for enhance the electromagnetic shielding effect.

Figure 10:
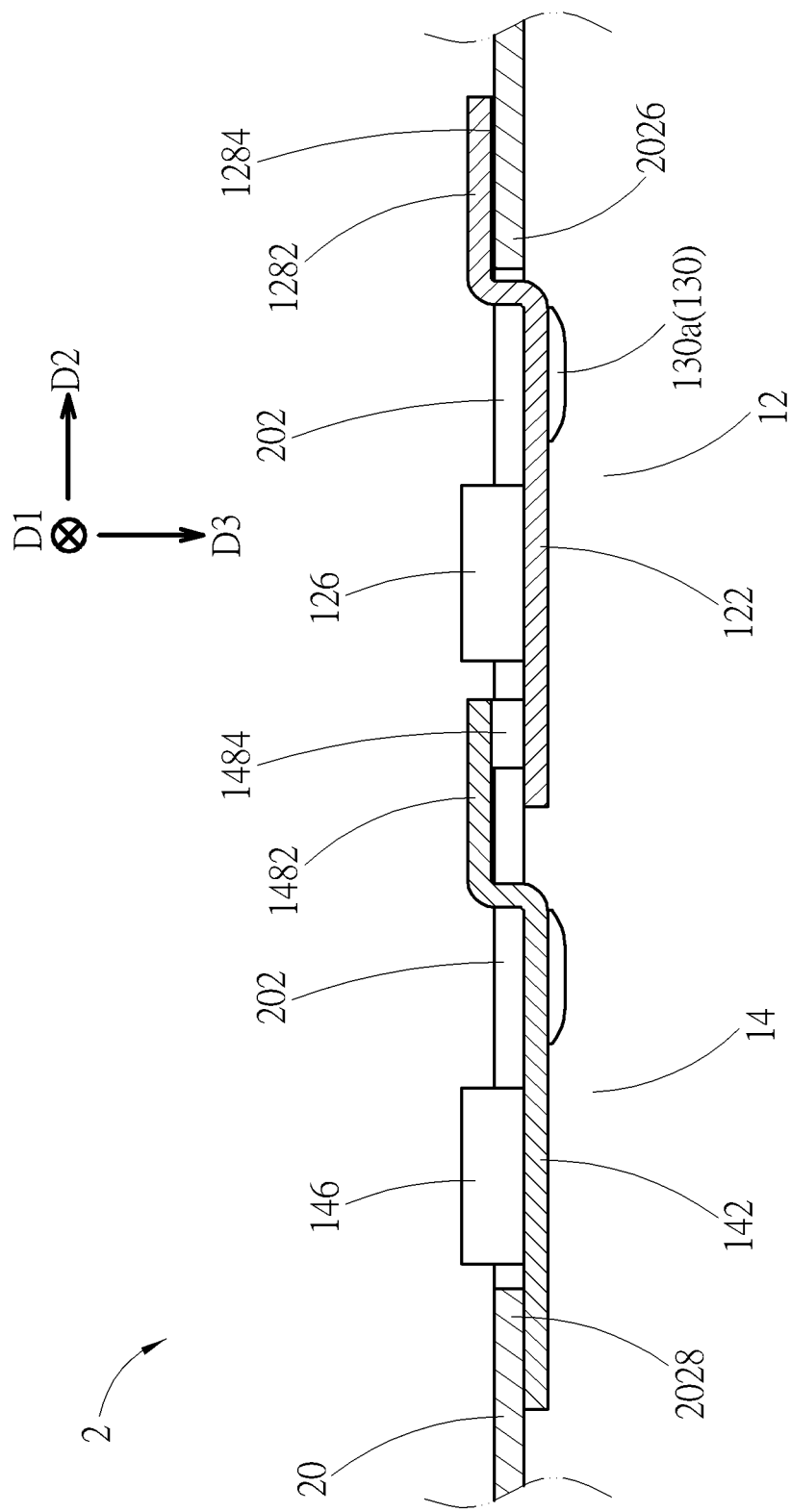
FIG. 10 is a sectional view of the electromagnetic shielding structure along the line Y-Y in FIG. 8.

Please also refer to FIG. 10. In the embodiment, the expansion card window 202 has an upper fringe portion 2022, a lower fringe portion 2024, a first side fringe portion 2026, and a second side fringe portion 2028. The first expansion card blank 12 is detachably fixed to the fixing frame 10 by the first fixing portion 124 detachably fixed to the upper fringe portion 2022 (e.g. through but not limited to a screw) and by the first abutting portion 126 abutting against the lower fringe portion 2024. The second expansion card blank 14 is detachably fixed to the fixing frame 10 by the second fixing portion 144 detachably fixed to the upper fringe portion 2022 (e.g. through but not limited to a screw)

and by the second abutting portion 146 abutting against the lower fringe portion 2024. The first flat plate portion 1282 and the first side fringe portion 2026 overlap in the third direction D3. The first elastic pieces 1284 elastically abut against the first side fringe portion 2026. The second flat plate portion 1482 and the first plate body 122 overlap in the third direction D3. The second elastic pieces 1484 elastically abut against the first plate body 122. The second plate body 142 touches the second side fringe portion 2028. The second plate body 142 and the second side fringe portion 2028 overlap in the third direction D3. Thereby, the first expansion card blank 12 and the second expansion card blank 14 are adjacent to each other, touch each other, and overlap. The first expansion card blank 12 and the second expansion card blank 14 as a whole is structurally connected to the four sides of the expansion card window 202, which is conducive to the electromagnetic shielding. Furthermore, in the embodiment, the first expansion card blank 12 and the second expansion card blank 14 substantially together cover the whole expansion card window 202, which further enhances the electromagnetic shielding effect.

In the embodiment, the expansion card window 202 can be regarded as an expansion card window of double width. In the electromagnetic shielding structure 1, the first expansion card window 102 and the second expansion card window 104 can be regarded as expansion card windows of standard width (or single width). As described in the foregoing, the first expansion card blank 12 and the second expansion card blank 14 can be used for an expansion card window of standard width (e.g. the first expansion card window 102 or the second expansion card window 104) respectively. The first expansion card blank 12 and the second expansion card blank 14 also can be used in combination to be suitable for an expansion card window of double width (e.g. the expansion card window 202). Similarly, in practice, it is practicable to use three of the first expansion card blank 12 (or the second expansion card blank 14) so as to be suitable for an expansion card window of triple width. Furthermore, in practice, for example, the first expansion card blank 12 and the second expansion card blank 14 are expansion card blanks of different widths. The first expansion card blank 12 and the second expansion card blank 14 can be used in different combinations in quantity (e.g. combining one first expansion card blank 12 and one second expansion card blank 14, combining one first expansion card blank 12 and two second expansion card blanks 14; therein, any two adjacent expansion card blanks can be connected through the adjoining portion) so as to cover a single expansion card window together.

Figure 11:
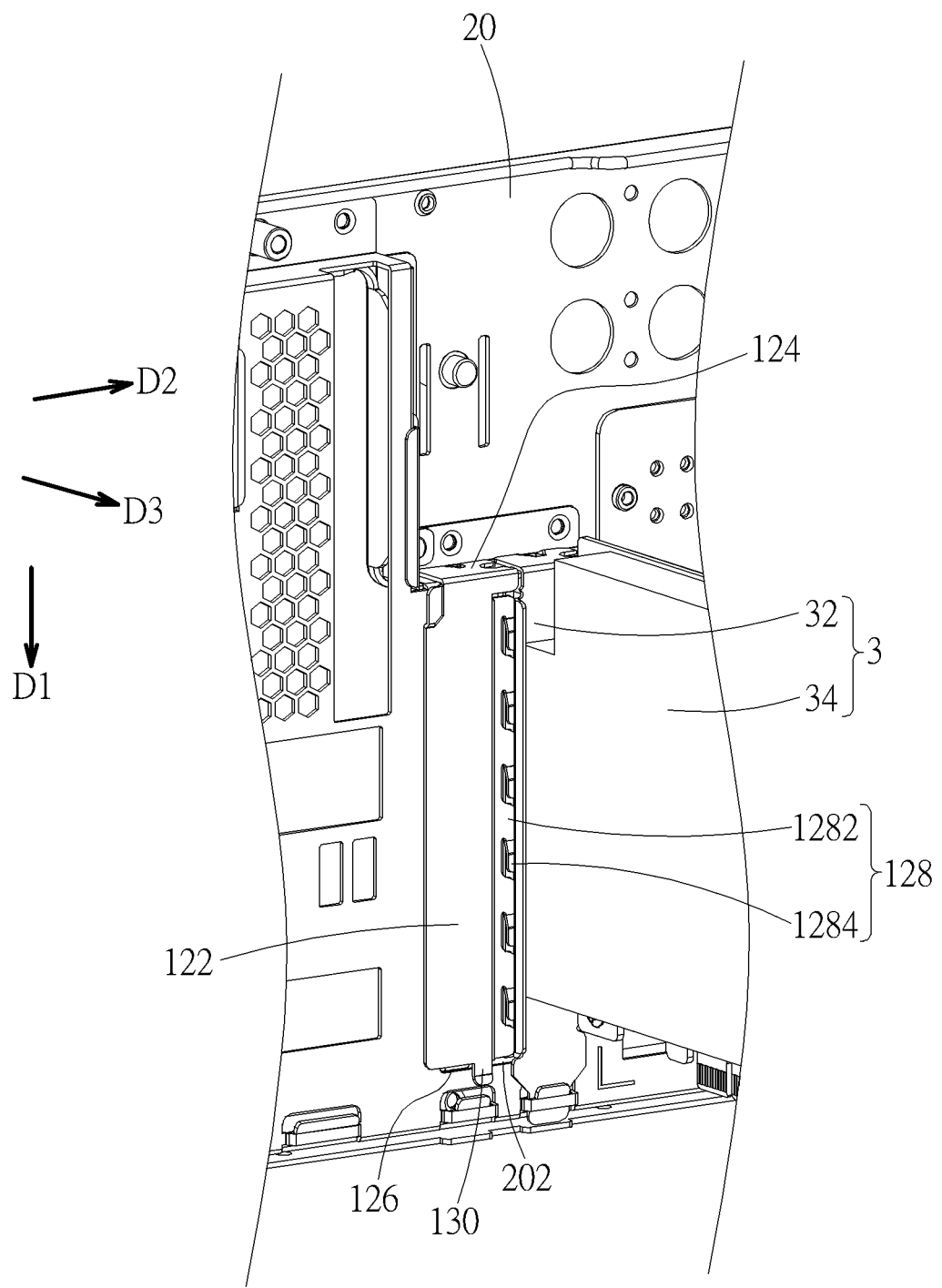
FIG. 11 is a schematic diagram illustrating the electromagnetic shielding structure in FIG. 8 with an expansion card thereon.
Figure 12:
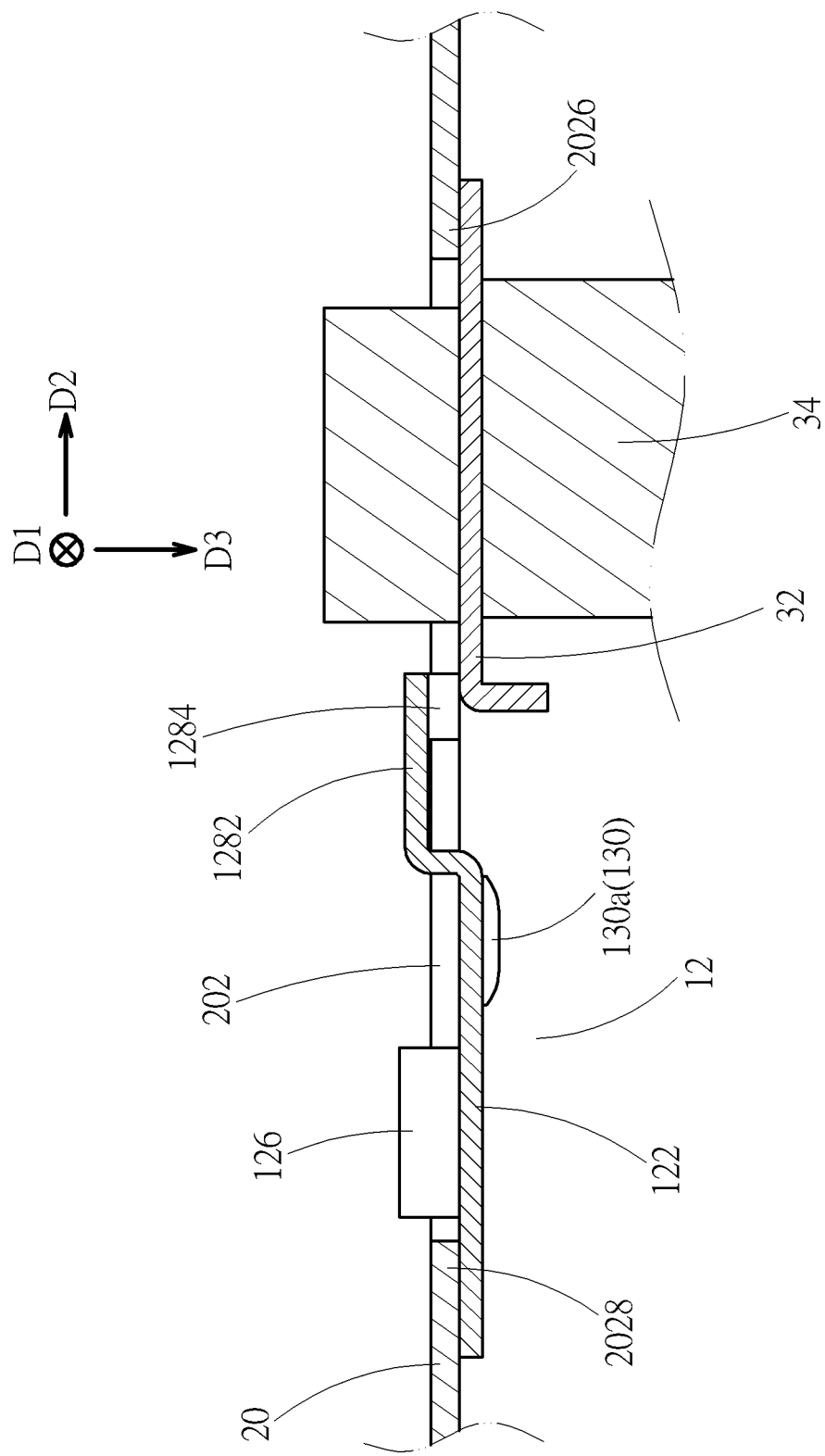
FIG. 12 is a sectional view of the electromagnetic shielding structure in FIG. 11, of which the location of the cutting plane is equivalent to the line Y-Y in FIG. 8.

Furthermore, in the embodiment, the expansion card window 202 can be regarded as an expansion card window of double width. In practice, one expansion card of standard width may be installed corresponding to the expansion card window 202 in the electronic apparatus, which makes the expansion card window 202 leave a gap required to be covered. As shown by FIG. 11 and FIG. 12, an expansion card 3 includes a fixing plate 32 and a circuit board module 34 (shown by a rectangle for simplification) fixedly connected to the fixing plate 32 and is detachably fixed to the fixing frame 20 through the fixing plate 32. The first expansion card blank 12 is detachably fixed to the fixing frame 20 adjacent to the expansion card 3. Therein, the fixing plate 32 covers a portion of the expansion card window 202. The first expansion card blank 12 is adjacent to the fixing plate 32 and covers a portion of the expansion card window 202. The first flat plate portion 1282 and the fixing plate 32 overlap in the third direction D3. The first elastic pieces 1284 elastically abut against the fixing plate 32, so that the gap between the first expansion card blank 12 and the fixing plate 32 can be eliminated or greatly reduced. Thereby, the first expansion card blank 12 and the fixing plate 32 can cover the expansion card window 202 together, so as to enhance the electromagnetic shielding effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electromagnetic shielding structure, comprising:
   a fixing frame, the fixing frame having an expansion card window, the expansion card window having an upper fringe portion and a lower fringe portion; and
   a first expansion card blank, comprising:
      a first plate body, the first plate body extending along a first direction;
      a first fixing portion, the first fixing portion being connected to a first side of the first plate body;
      a first abutting portion, the first abutting portion being connected to a second side of the first plate body, the second side being opposite to the first side in the first direction; and
      a first adjoining portion, the first adjoining portion comprising a first flat plate portion and a plurality of first elastic pieces, the first flat plate portion being connected to a third side of the first plate body and extending parallel to the first plate body along a second direction, the third side being located between the first side and the second side, the second direction being perpendicular to the first direction, the first elastic pieces protruding from the first flat plate portion in a third direction, the third direction being perpendicular to the first direction and the second direction;
   wherein the first expansion card blank is detachably fixed to the fixing frame by the first fixing portion detachably fixed to the upper fringe portion and by the first abutting portion abutting against the lower fringe portion, so that the first plate body cover the expansion card window.

2. The electromagnetic shielding structure according to claim 1, wherein the expansion card window has a first side fringe portion between the upper fringe portion and the lower fringe portion, the first flat plate portion and the first side fringe portion overlap in the third direction, and the first elastic pieces elastically abut against the first side fringe portion.

3. The electromagnetic shielding structure according to claim 2, wherein the first flat plate portion and the first plate body are disposed to be staggered in the third direction.

4. The electromagnetic shielding structure according to claim 2, wherein the first flat plate portion and the first plate body are located at two sides of the lower fringe portion in the third direction.

5. The electromagnetic shielding structure according to claim 2, wherein the expansion card window has a second side fringe portion between the upper fringe portion and the lower fringe portion and opposite to the first side fringe portion, the first plate body touches the second side fringe portion, and the first plate body and the second side fringe portion overlap in the third direction.

6. The electromagnetic shielding structure according to claim 2, further comprising a second expansion card blank, wherein the second expansion card blank comprises a second plate body, a second fixing portion, a second abutting portion, and a second adjoining portion, the second fixing portion and the second abutting portion are connected to two opposite sides of the second plate body respectively, the second adjoining portion is connected to another side of the first plate body, the second adjoining portion comprises a second flat plate portion and a plurality of second elastic pieces connected to the second flat plate portion, the second elastic pieces protrude from the second flat plate portion, and the second expansion card blank is detachably fixed to the fixing frame by the second fixing portion detachably fixed to the upper fringe portion and by the second abutting portion abutting against the lower fringe portion, so that the second plate body cover the expansion card window, the second flat plate portion and the first plate body overlap in the third direction, and the second elastic pieces elastically abut against the first plate body.

7. The electromagnetic shielding structure according to claim 6, wherein the expansion card window has a second side fringe portion between the upper fringe portion and the lower fringe portion and opposite to the first side fringe portion, the second plate body touches the second side fringe portion, and the second plate body and the second side fringe portion overlap.

8. The electromagnetic shielding structure according to claim 7, wherein the first expansion card blank and the second expansion card blank together cover the whole expansion card window.

9. The electromagnetic shielding structure according to claim 6, wherein the first expansion card blank and the second expansion card blank are structurally the same.

10. The electromagnetic shielding structure according to claim 6, wherein the first plate body has a flat protrusion adjacent to the first fixing portion at a fourth side of the first plate body, the fourth side is opposite to the third side in the second direction, and the flat protrusion and the second plate body overlap in the third direction.

11. The electromagnetic shielding structure according to claim 10, wherein the flat protrusion touches the second plate body.

12. The electromagnetic shielding structure according to claim 1, wherein the first expansion card blank comprises a guiding portion connected to the second side of the first plate body adjacent to the first abutting portion, the guiding portion and the first abutting portion are located at two sides of the lower fringe portion in the third direction, and the guiding portion has a guiding slope surface.

13. The electromagnetic shielding structure according to claim 12, wherein the guiding slope surface protrudes from the first abutting portion in the first direction.

14. The electromagnetic shielding structure according to claim 1, an expansion card comprising a fixing plate and being fixed to the fixing frame through the fixing plate, wherein the first expansion card blank is detachably fixed to the fixing frame adjacent to the fixing plate, the first flat plate portion and the fixing plate overlap in the third direction, and the first elastic pieces elastically abut against the fixing plate.

15. The electromagnetic shielding structure according to claim 1, wherein the first expansion card blank is a metal stamping part.

16. An expansion card blank, comprising:
a plate body, the plate body extending along a first direction;
a fixing portion, the fixing portion being connected to a first side of the plate body;
an abutting portion, the abutting portion being connected to a second side of the plate body, the second side being opposite to the first side in the first direction; and
an adjoining portion, the adjoining portion comprising a flat plate portion and a plurality of elastic pieces, the flat plate portion being connected to a third side of the plate body and extending parallel to the plate body along a second direction, the third side being located between the first side and the second side, the second direction being perpendicular to the first direction, the elastic pieces protruding from the flat plate portion in a third direction, the third direction being perpendicular to the first direction and the second direction.

17. The expansion card blank according to claim 16, wherein the flat plate portion and the plate body are disposed to be staggered in the third direction.

18. The expansion card blank according to claim 16, wherein the plate body has a first surface and a second surface opposite to the first surface in the third direction, the flat plate portion has a third surface in the third direction toward the second surface, the elastic piece protrudes from the third surface and has a contact surface, and the contact surface and the second surface are coplanar.

19. The expansion card blank according to claim 16, wherein the plate body has a flat protrusion adjacent to the fixing portion at a fourth side of the plate body, and the fourth side is opposite to the third side in the second direction.

20. The expansion card blank according to claim 19, wherein the flat protrusion and the abutting portion are located at two sides of the plate body in the third direction.

21. The expansion card blank according to claim 16, further comprising a guiding portion connected to the second side of the plate body adjacent to the abutting portion, wherein the guiding portion and the abutting portion are disposed at an interval in the third direction, and the guiding portion has a guiding slope surface.

22. The expansion card blank according to claim 21, wherein the guiding slope surface protrudes from the abutting portion in the first direction.

23. The expansion card blank according to claim 16 being a metal stamping part.

* * * * *